United States Patent
Ahn

(10) Patent No.: US 10,212,819 B2
(45) Date of Patent: Feb. 19, 2019

(54) FLEXIBLE CIRCUIT BOARD AND DISPLAY DEVICE INCLUDING THE SAME

(71) Applicant: Samsung Display Co., Ltd., Yongin-si, Gyeonggi-do (KR)

(72) Inventor: Hyeong-Cheol Ahn, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 218 days.

(21) Appl. No.: 15/051,434

(22) Filed: Feb. 23, 2016

(65) Prior Publication Data
US 2016/0270234 A1    Sep. 15, 2016

(30) Foreign Application Priority Data
Mar. 13, 2015   (KR) ................. 10-2015-0035256

(51) Int. Cl.
| | |
|---|---|
| G06F 3/041 | (2006.01) |
| G01L 19/00 | (2006.01) |
| H04N 5/225 | (2006.01) |
| H01L 27/146 | (2006.01) |
| H01L 23/13 | (2006.01) |
| H01L 21/50 | (2006.01) |
| H05K 1/02 | (2006.01) |

(Continued)

(52) U.S. Cl.
CPC ............ *H05K 1/189* (2013.01); *G06F 3/047* (2013.01); *G06F 3/0412* (2013.01); *H05K 1/028* (2013.01); *H05K 1/0296* (2013.01); *G06F 2203/04102* (2013.01); *H05K 1/118* (2013.01); *H05K 2201/055* (2013.01); *H05K 2201/056* (2013.01); *H05K 2201/09063* (2013.01); *H05K 2201/09781* (2013.01); *H05K 2201/10121* (2013.01); *H05K 2201/10128* (2013.01); *H05K 2201/10136* (2013.01); *H05K 2201/10681* (2013.01)

(58) Field of Classification Search
CPC ...................................................... H01L 23/13
See application file for complete search history.

(56) References Cited

U.S. PATENT DOCUMENTS

| | | | |
|---|---|---|---|
| 4,716,259 A * | 12/1987 | Tokura ................ | H05K 1/028 174/254 |
| 2004/0041938 A1 * | 3/2004 | Seo .................... | H04N 5/2253 348/340 |

(Continued)

FOREIGN PATENT DOCUMENTS

| | | | |
|---|---|---|---|
| CN | 101150077 | * 3/2008 | ............ H01L 21/50 |
| DE | 20 2004 007 207 U1 | 1/2005 | |

(Continued)

OTHER PUBLICATIONS

Extended European Search Report dated Aug. 18, 2016 for European Patent Application No. EP 16 159 776.0 which corresponds to subject U.S. Appl. No. 15/051,434.

(Continued)

*Primary Examiner* — Lin Li
(74) *Attorney, Agent, or Firm* — Lewis Roca Rothgerber Christie LLP

(57) ABSTRACT

A flexible circuit board and display device including the same are disclosed. In one aspect, the flexible circuit board includes a base film including a bending area and a plurality of signal wires formed over the bending area of the base film. At least one through-hole is defined in the base film.

17 Claims, 12 Drawing Sheets

(51) Int. Cl.
  *H05K 1/18* (2006.01)
  *G06F 3/047* (2006.01)
  *H05K 1/11* (2006.01)

(56) References Cited

U.S. PATENT DOCUMENTS

| | | | | |
|---|---|---|---|---|
| 2004/0095501 | A1* | 5/2004 | Aizawa | H01L 27/14618 348/340 |
| 2005/0104991 | A1* | 5/2005 | Hoshino | H04N 5/2253 348/340 |
| 2006/0038019 | A1* | 2/2006 | Kajiwara | H04M 1/0216 235/472.02 |
| 2006/0198253 | A1 | 9/2006 | Omori et al. | |
| 2007/0077805 | A1 | 4/2007 | Nomura et al. | |
| 2010/0148207 | A1* | 6/2010 | Ryutani | H01L 23/13 257/99 |
| 2011/0075384 | A1* | 3/2011 | Yeates | H05K 1/0271 361/752 |
| 2012/0195024 | A1* | 8/2012 | Kawaguchi | H05K 3/363 362/97.2 |
| 2012/0250925 | A1* | 10/2012 | Lillelund | H04R 19/016 381/355 |
| 2013/0182325 | A1* | 7/2013 | Minamisawa | G03B 5/00 359/554 |
| 2014/0131889 | A1* | 5/2014 | Kim | H01L 23/49838 257/774 |
| 2014/0307397 | A1* | 10/2014 | Osako | H05B 33/02 361/749 |
| 2014/0342203 | A1* | 11/2014 | Elian | G01L 19/0069 429/90 |
| 2015/0185527 | A1* | 7/2015 | Chang | H01L 27/323 349/12 |
| 2016/0212332 | A1* | 7/2016 | Tang | H04N 5/23232 |

FOREIGN PATENT DOCUMENTS

| | | | | |
|---|---|---|---|---|
| EP | 1 651 015 A1 | | 4/2006 | |
| JP | WO 2004/054334 A1 | * | 11/2007 | ............... H05K 1/02 |
| KR | 10-2004-0065440 A | | 7/2004 | |
| KR | 10-2008-0059836 A | | 7/2008 | |
| KR | 10-2012-0049733 A | | 5/2012 | |
| KR | 10-2014-0123771 A | | 10/2014 | |

OTHER PUBLICATIONS

EPO Extended Search Report dated Sep. 5, 2018, for corresponding European Patent Application No. 18166049.9 (7 pages).

* cited by examiner

FLEXIBLE CIRCUIT BOARD AND DISPLAY DEVICE INCLUDING THE SAME

CROSS-REFERENCE TO RELATED APPLICATION

This application claims priority to and the benefit of Korean Patent Application No. 10-2015-0035256 filed in the Korean Intellectual Property Office on Mar. 13, 2015, the entire contents of which are incorporated herein by reference.

BACKGROUND

Field

The described technology generally relates to a flexible circuit board and a display device including the same.

Description of the Related Technology

Liquid crystal displays (LCDs) include a liquid crystal panel in which liquid crystal is injected into a space formed between an upper substrate and a lower substrate. LCDs also include polarizers formed on opposing sides of the liquid crystal panel to polarize light and a light source and a light guide for supplying a predetermined amount of light to the liquid crystal panel. Due to the above-described LCD structure, they are able to display images based on signals received from an image source.

Organic light-emitting diode (OLED) displays includes two electrodes and an organic emission layer positioned therebetween. Electrons injected from a cathode and holes injected an anode are recombined with each other in the organic emission layer to generate excitons and the excitons release energy in the form of emitted light.

OLED displays are self-luminous since they do not require a separate light source to emit light in contrast to LCDs. Accordingly, they can be manufactured to have a relatively thin profile and to be lightweight. In addition, OLED displays have other high-quality characteristics, such as low power consumption, high luminance, fast response speeds, etc., and have been garnering attention due to these characteristics.

One recently developed OLED technology is a flexible and/or stretchable OLED display having a substrate formed of a flexible and/or stretchable material such as plastic or foil, which can easily be formed into a thin and lightweight display having a large display area.

Another technology that has been developed is an LCD having a curved display panel or a flexible display panel.

Flexible displays are connected to a flexible printed circuit board (FPCB) including a driving circuit which is connected to an electrode of a display panel through a chip on film (COF) on which a driving integrated circuit is mounted. A pad portion of the FPCB and a pad portion of an integrated circuit film are connected by an anisotropic conductive film (ACF) to form a conductive structure.

The above information disclosed in this Background section is only intended to facilitate the understanding of the background of the described technology, and therefore, it may contain information that does not form the prior art that is already known in this country to a person of ordinary skill in the art.

SUMMARY OF CERTAIN INVENTIVE ASPECTS

One inventive aspect is a flexible circuit board that can be formed to overlap with a camera aperture.

Another aspect is a display device including a camera that is formed at a center of an upper portion of the display device.

Another aspect is a flexible circuit board, including: a base film including a bending area; and a plurality of signal wires formed on the base film to cross the bending area, wherein at least one through-hole passing through the base film is formed in the base film.

The at least one through-hole can be formed in the bending area.

The flexible circuit board can further include an integrated circuit (IC) chip formed on the base film and connected to the plurality of signal wires.

The signal wires and the IC chip can be formed on the same surface or different surfaces of the base film.

The flexible circuit board can further include a first pad portion formed at one end portion of each of the signal wires; and a second pad portion formed at the other end portion of each of the signal wires.

The flexible circuit board can further include a dummy wire substantially parallel to the signal wires and formed to be adjacent to the through-hole.

The flexible circuit board can further include a third pad portion formed at one end portion of the dummy wire.

The first and third pad portions can be arranged in a line.

The through-hole can be formed as a pair, and the two through-holes of the pair are symmetrical based on the bending area.

The pair of the through-holes can be arranged in a direction perpendicular to the bending area.

Another aspect is a display device, including: a display panel displaying an image; a first flexible circuit board of which the one end portion is connected to the display panel, and in which at least one first through-hole is formed; a driving circuit substrate connected to the other end portion of the first flexible circuit board and driving the display panel; and a camera capturing an external image, wherein the first flexible circuit board is bent based on a bending area so that the driving circuit substrate and the display panel face each other, and at least part of the camera is positioned in the at least one first through-hole.

The at least one first through-hole can be formed in the bending area of the first flexible circuit board, and the at least part of the camera is positioned in a first through-hole that is bent.

The display device can further include a touch panel arranged on the display panel and a second flexible circuit board, one end portion of which is connected to the touch panel, and which includes at least one second through-hole formed in the bending area.

The second flexible circuit board can be bent based on the second through-hole of the bending area, and at least part of the camera can be positioned in the first and second through-holes that are bent.

The first flexible circuit board can include a first base film including the at least one first through-hole formed in the bending area; a plurality of first signal wires formed on the first base film to cross the bending area; and an IC chip arranged on the first base film and connected to the plurality of the first signal wires.

The first flexible circuit board can further include a first pad portion formed at one end portion of each of the first signal wires to be connected the display panel and a second pad portion formed at the other end portion of each of the first signal wires to be connected to the driving circuit substrate.

The first flexible circuit board can further include a dummy wire parallel to the first signal wires and formed to be adjacent to the first through-hole; and a third pad portion formed at one end portion of the dummy wire to be connected to the display panel.

The first and third pad portions can be arranged in a line.

A sectional shape of the first through-hole can correspond to that of the camera.

The first through-hole can be formed as a pair, and the camera can pass through the pair of the first through-holes.

Another aspect is a flexible circuit board, comprising a base film including a bending area; and a plurality of signal wires formed over the base film so as to cross the bending area, wherein at least one through-hole is defined in the base film.

In exemplary embodiments, the through-hole is defined in the bending area. The flexible circuit board can further comprise an integrated circuit (IC) chip arranged over the base film and electrically connected to the signal wires. The signal wires and the IC chip can be formed on the same surface or different surfaces of the base film. The base film can further comprise a first pad region in which a first end of each of the signal wires is located; and a second pad region in which a second end of each of the signal wires is located. The flexible circuit board can further comprise at least one dummy wire that is formed: i) substantially parallel to the signal wires and ii) adjacent to the through-hole.

In exemplary embodiments, the flexible circuit board further comprises a third pad region in which an end of the dummy wire is located. The first and third pad regions can be arranged in a line. The at least one through-hole can comprise a pair of through-holes, and the pair of through-holes can be symmetrically arranged with respect to the bending area. The pair of through-holes can be arranged in a direction perpendicular to the direction in which the bending area extends.

Another aspect is a display device, comprising a display panel configuration to display an image; a first flexible circuit board having a first end electrically connected to the display panel and a second end opposing the first end, wherein at least one first through-hole is defined in the first flexible circuit board; a driving circuit substrate electrically connected to the second end of the first flexible circuit board, wherein the driving circuit substrate is configured to drive the display panel; and a camera configured to capture an image, wherein the first flexible circuit board is bent along a bending area so that the driving circuit substrate and the display panel overlap each other, and wherein at least a portion of the camera is positioned in the first through-hole.

In exemplary embodiments, the first through-hole is defined in the bending area of the first flexible circuit board. The display device can further comprise a touch panel formed over the display panel; and a second flexible circuit board having i) an end electrically connected to the touch panel and ii) a bending area, wherein at least one second through-hole is defined in the bending area of the second flexible circuit board. The second flexible circuit board can be bent along the bending area and the portion of the camera can be positioned in the first and second through-holes.

In exemplary embodiments, the first flexible circuit board includes a first base film including the first through-hole defined therein; a plurality of first signal wires formed over the first base film so as to cross the bending area; and an IC chip formed over the first base film and electrically connected to the first signal wires. The first flexible circuit board can further include a first pad region in which a first end of each of the first signal wires is located; and a second region in which a second of each of the first signal wires is located, the first and second regions opposing each other.

In exemplary embodiments, the first flexible circuit board further includes a dummy wire formed substantially parallel to the first signal wires and adjacent to the first through-hole; and a third pad region in which an end of the dummy wire is located, wherein the third pad is connected to the display panel. The first and third pad regions can be arranged in a line. A sectional shape of the first through-hole can correspond to the shape of the camera. The at least one first through-hole can comprise a pair of first through-holes and the camera can pass through the pair of the first through-holes.

According to at least one embodiment, it is possible to arrange the camera in close proximity to the center of the display device without increasing dead space.

Further, according to at least one embodiment, since the camera is arranged in close proximity to the center of the display device, images of objects can be accurately captured.

DETAILED DESCRIPTION OF CERTAIN INVENTIVE EMBODIMENTS

Figure 1:
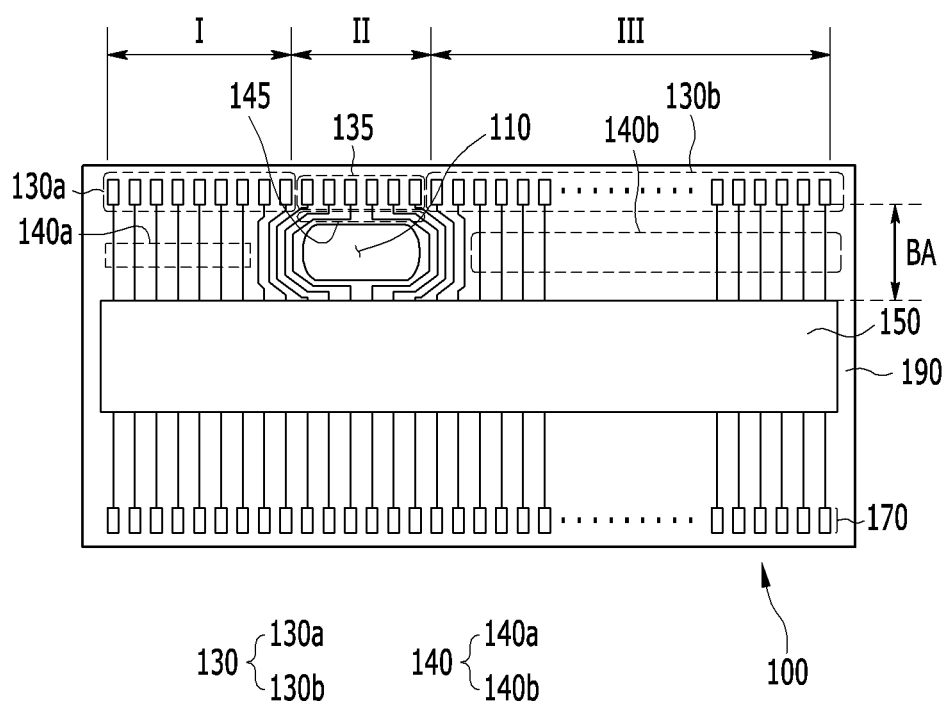
FIG. 1 is a top plan view of a flexible circuit board according to an exemplary embodiment.

In an electronic device including a camera that can capture external images, for example, a portable terminal like a mobile phone, the camera is typically not formed at the center of the upper side. Instead, it is offset to the left or right side. This is because a chip on film connecting the display panel to the FPCB is positioned at the upper side of the portable terminal. That is, because of space constraints due to the chip on film being positioned at the upper side, the camera must be offset to the left or right side so that it does not overlap with the chip on film.

Since the camera is not formed at the center of the upper side of the portable terminal, it is not easy for a user to hold the portable terminal and stably capture images.

Hereinafter, exemplary embodiments will be described in detail with reference to the attached drawings such that the described technology can be easily made and used by those skilled in the art. As those skilled in the art would realize, the described embodiments may be modified in various different ways, all without departing from the spirit or scope of the described technology. The drawings and description are to be regarded as illustrative in nature and not restrictive. Like reference numerals designate like elements throughout the specification.

Further, in the drawings, size and thickness of each element may be exaggerated for the sake of clarity, and the described technology is not necessarily limited to what is illustrated in the drawings.

In the drawings, the thicknesses of layers, films, panels, regions, etc., may be exaggerated for the sake of clarity. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "on" means positioning on or below an object, and does not necessarily mean positioning on the upper side of the object based on the illustrated direction of gravity.

Hereinafter, a flexible circuit board according to an exemplary embodiment will be described with reference to FIGS. 1 and 2.

FIG. 1 is a top plan view of a flexible circuit board according to an exemplary embodiment. FIG. 2 is a drawing illustrating a configuration in which the flexible circuit board according to the exemplary embodiment is bent.

Referring to FIG. 1, the flexible circuit board 100 according to an exemplary embodiment includes a base film 190, a plurality of signal wires 140, 140a, and 140b, a dummy wire 145, first to third pad portions or pad regions 130, 170, and 135, and an integrated circuit (IC) chip 150. Further, at least one through-hole 110 may be formed in the flexible circuit board 100 according to the exemplary embodiment. When the flexible circuit board 100 is bent, a camera 700 to be described later can be installed within the through-hole 110. A plurality of through-holes can be formed in the flexible circuit board 100, but a flexible circuit board in which one through-hole 110 is formed will be substantially described in the present exemplary embodiment. In addition, the positional relationship between the through-hole 110 and the camera 700 will be described later.

The flexible circuit board according to the exemplary embodiment can be an FPCB or a COF. When the IC chip 150 is mounted on the flexible circuit board, the flexible circuit board 100 according to the exemplary embodiment can be a COF. When the flexible circuit board does not include an IC chip, the flexible circuit board according to the exemplary embodiment can be an FPCB. Hereinafter, an exemplary embodiment in which the flexible circuit board 100 is a COF will be described.

The base film 190 can be a flexible film. The base film 190 can be formed of a polyimide resin, an epoxy-based resin, or a known flexible material. The signal wires 140, 140a, and 140b, and the IC chip 150 can be formed on the base film 190.

Figure 2:
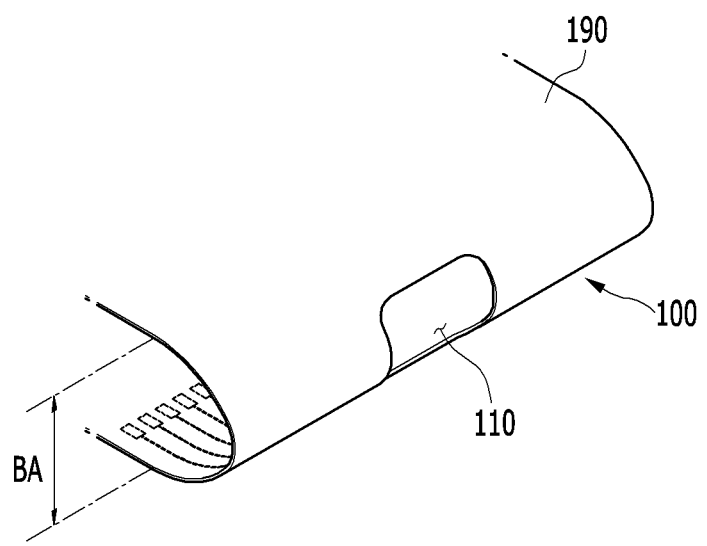
FIG. 2 is a drawing illustrating a configuration in which the flexible circuit board according to the exemplary embodiment is bent.

Referring to FIGS. 1 and 2, the base film 190 includes a bending area. The bending area BA is an area where the base film 190 is bent, the flexible circuit board 100 according to the exemplary embodiment can be bent based on the bending area BA.

According to the exemplary embodiment, the through-hole 110 through the base film 190 can be formed in the base film 190. In this embodiment, the through-hole 110 is formed in bending area BA.

Referring to FIG. 2, when the flexible circuit board 100 according to the exemplary embodiment is bent in the bending area BA, a groove is formed in a lateral surface of the flexible circuit board 100. For example, when the flexible circuit board 100 is bent, the sectional shape of the through-hole 110 is changed from a circular shape to a semi-circular shape. That is, when the bent flexible circuit board 100 is viewed from top toward bottom, the through-hole 110 is changed to a grooved shape.

Referring to FIG. 1, the sectional shape of through-hole 110 can be circular, oval, or polygonal. The polygonal shape can include quadrangular, pentagonal, hexagonal, and octagonal shapes.

Meanwhile, the signal wires 140 can be formed on the base film 190. The signal wires 140 serve to transmit an electrical signal necessary for driving a display panel provided in the display device from an external driving circuit to the display panel.

The signal wires 140 can be formed on the base film 190 to cross the bending area BA. The signal wires 140 are formed in an area excluding a periphery area of through-hole 110. That is, the signal wires 140 are formed in the remaining area (areas I and III) other than the peripheral area (area II) in which the through-hole 110 is formed.

In FIG. 1, areas I, II and III represent regions of the bending area BA divided in a direction perpendicular to the direction in which bending area BA extends. Area II represents an area adjacent to the through-hole 110, and areas I and III represent remaining areas other than area II.

The signal wires 140 can be differentiated by the signal wires 140a and 140b respectively formed in areas I and III.

First pad portions 130a and 130b are formed at one end of the signal wires 140a and 140b. Further, a second pad portion 170 is formed at the other end of the signal wires 140a and 140b. The first pad portions 130a and 130b can be connected to a display panel 900 to be described later, and the second pad portion 170 can be connected to a driving circuit substrate 300.

The first pad portions 130a and 130b and the second pad portion 170 can be terminals for power control and/or signal input/output from an external circuit (not shown). For example, the first pad portions 130a and 130b can be signal output pads transmitting a signal to a pixel of the display panel, and the second pad portion 170 can be a signal input pad receiving data and control signals received from a source.

Referring to FIG. 1, according to the exemplary embodiment, a dummy wire 145 can be formed on the base film 190. The dummy wire 145 is formed to be adjacent to the through-hole 110 and formed to be substantially parallel to the signal wires 140a and 140b formed in areas I and III. That is, the dummy wire 145 is formed in area II to cross the bending area BA.

As shown in FIG. 1, the third pad portion 135 is formed at one end portion of the dummy wire 145. The third pad portion 135 is arranged in a line with the first pad portions 130a and 130b. The first and third pad portions 130a, 130b, and 135 can be connected to the display panel of the display device to be described later.

According to an exemplary embodiment, the dummy wire 145 and the third pad portion 135 do not transmit an electrical signal necessary for driving the display panel. The third pad portion 135 provides only a bond to the display panel. When there is no the third pad portion 135, the bonding force with the display panel weakens in area II and the display panel and the first pad portions 130a and 130b may gradually be separated from each other in areas I and III adjacent to area II.

Meanwhile, the IC chip 150 can be formed on the base film 190. The IC chip 150 is mounted on the base film 190 to be able to generate a driving signal. For example, an electrical signal generated by the driving circuit substrate 300 is input to the second pad portion 170 and then it can be transmitted to the first pad portion 130a and 130b through the IC chip 150.

For example, the IC chip 150 can be a scan driving circuit, or scan driver, generating a scan signal, or a data driving circuit, or data driver, generating a data signal. Accordingly, the IC chip 150 can receive a control signal to generate the scan signal or the data signal. The scan signal or the data signal can be transmitted to the display panel through the signal wires 140a and 140b formed on the base film 190.

According to the exemplary embodiment, the signal wires 140a and 140b and the IC chip 150 can be formed on the same surface of the base film 190 or on different surfaces thereof. More specifically, the signal wires 140a and 140b and the IC chip 150 can be formed on the same surface of the base film 190. That is, both the signal wires 140a and 140b and the IC chip 150 can be formed on a top surface of the base film 190, or on a bottom surface of the base film 190. Further, the signal wires 140a and 140b and the IC chip 150 can be respectively formed on different surfaces of the base film 190. That is, the signal wires 140a and the IC chip 150 can be respectively formed on the top and bottom surfaces of the base film 190, or vice versa.

A flexible circuit board according to another exemplary embodiment will now be described with reference to FIGS. 3 and 4. When describing the flexible circuit board according to another exemplary embodiment, a detailed description of the same components as those of the aforementioned flexible circuit board will be omitted.

Figure 3:
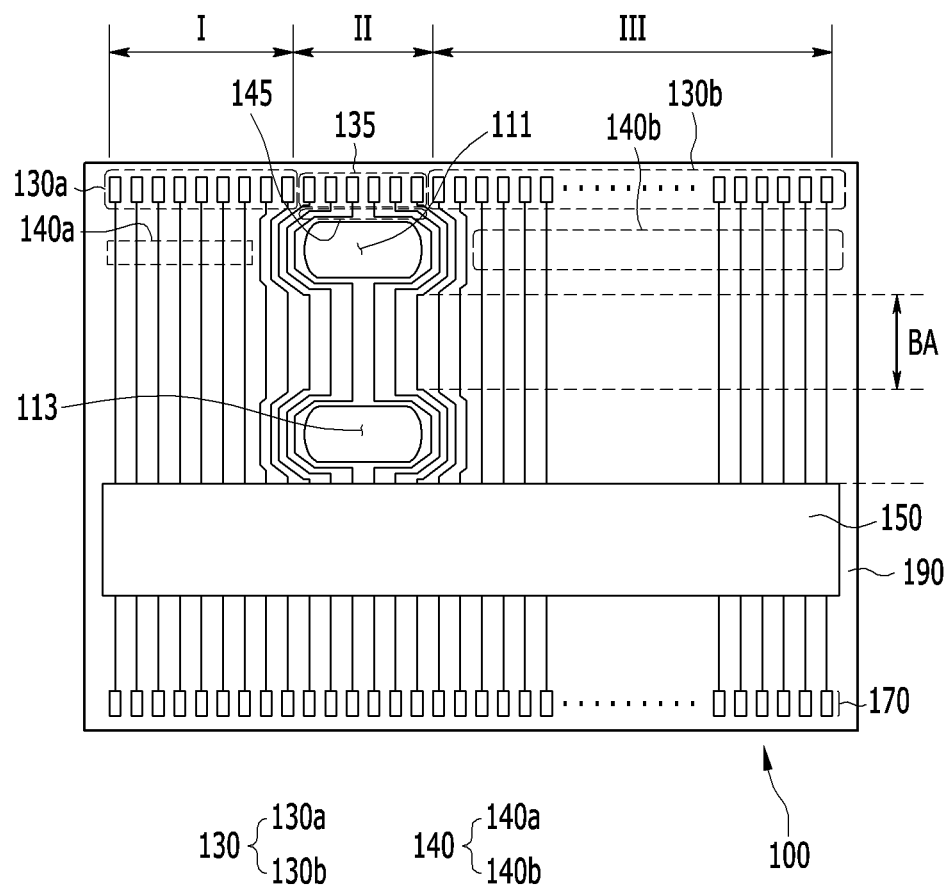
FIG. 3 is a top plan view of a flexible circuit board according to another exemplary embodiment.

FIG. 3 is a top plan view of a flexible circuit board according to another exemplary embodiment. FIG. 4 is a drawing illustrating a configuration in which the flexible circuit board according to the other exemplary embodiment is bent.

Referring to FIG. 3, a pair of through-holes 111 and 113 can be formed in a flexible circuit board 100 according to the other exemplary embodiment. The pair of the through-holes 111 and 113 are symmetrically arranged based on the bending area BA. As shown in FIG. 3, the pair of the through-holes 111 and 113 can be arranged perpendicular to the bending area BA.

Figure 4:
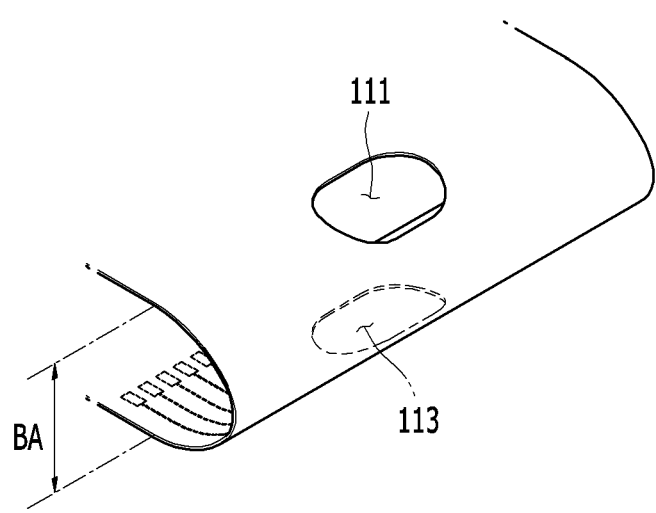
FIG. 4 is a drawing illustrating a configuration in which the flexible circuit board according to the other exemplary embodiment is bent.

Referring to FIG. 4, when the flexible circuit board 100 is bent based on the bending area BA, the pair of the through-holes 111 and 113 face each other (i.e., the pair of through-holes 111 and 113 are aligned with each other). More specifically, the pair of the through-holes 111 and 113 are formed side by side for the camera to be described later to pass through the pair of the through-holes 111 and 113.

A display device including the flexible circuit board according to the exemplary embodiment will now be described with reference to FIGS. 5 to 10 together with FIGS. 1 and 2. When describing the display device including the flexible circuit board according to the exemplary embodiment, a detailed description of the same components as those of the aforementioned flexible circuit board will be omitted.

Figure 5:
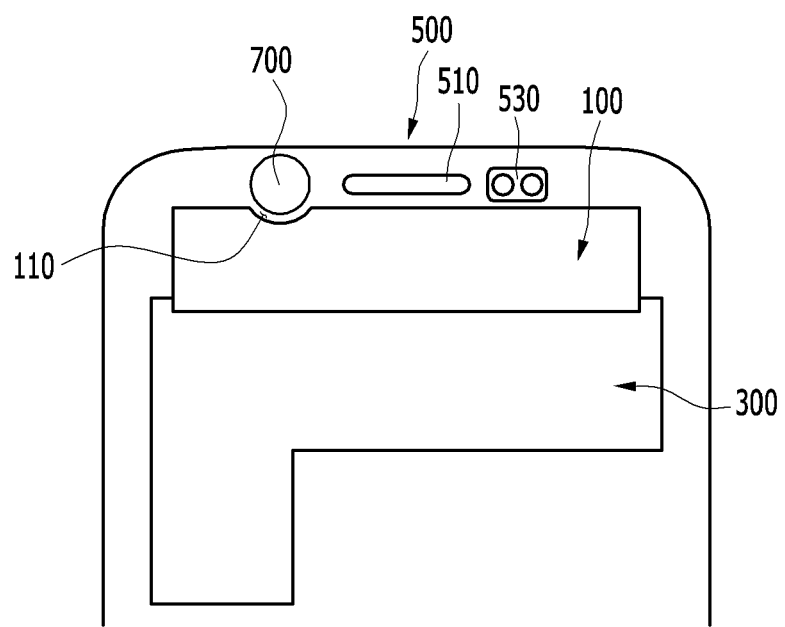
FIG. 5 is a partial top plan view of a display device according to an exemplary embodiment.
Figure 6:
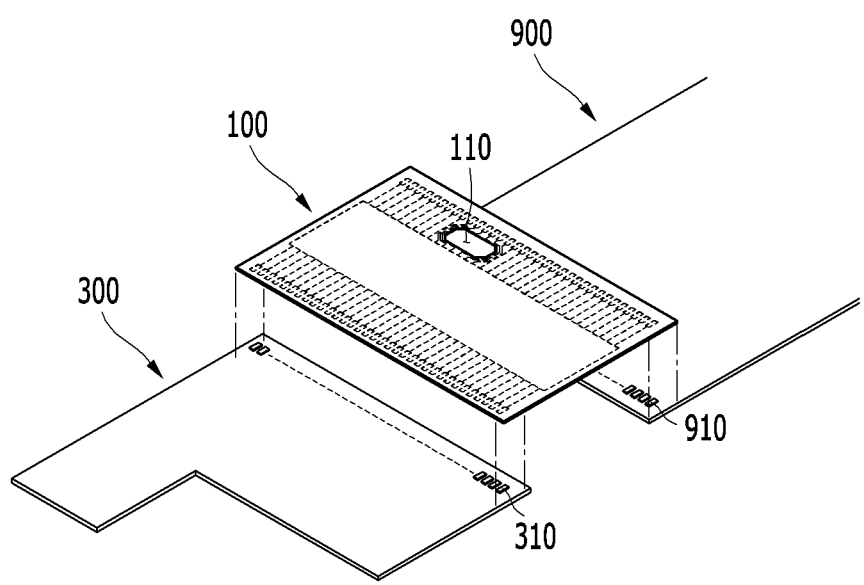
FIG. 6 is an exploded perspective view of a display panel, a first flexible circuit board, and a driving circuit substrate that are applied to the display device according to the exemplary embodiment.
Figure 7:
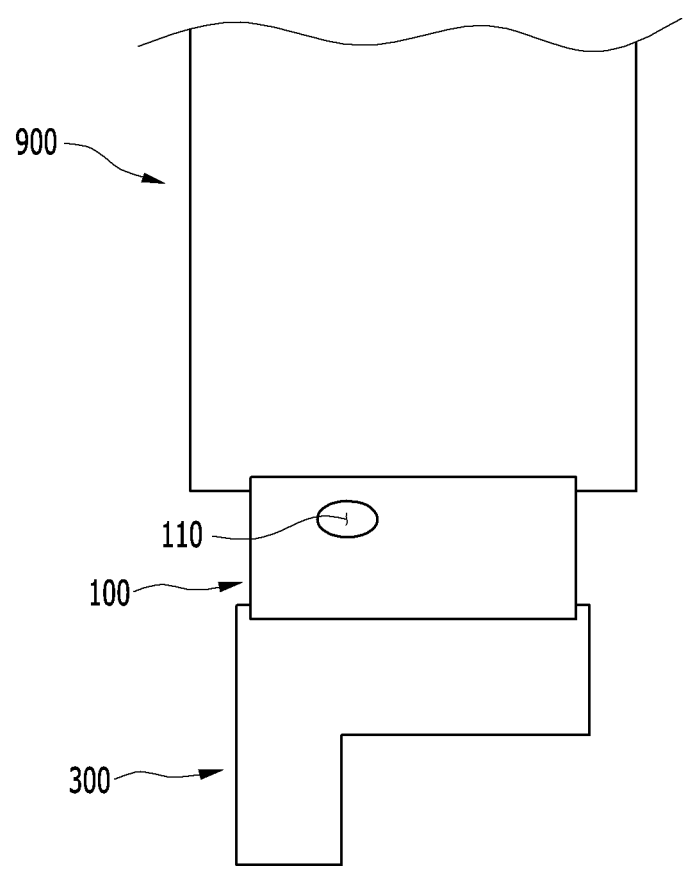
FIG. 7 is a drawing illustrating a unfolded configuration of the display panel, the first flexible circuit board, and the driving circuit substrate that are applied to the display device according to the exemplary embodiment.
Figure 8:
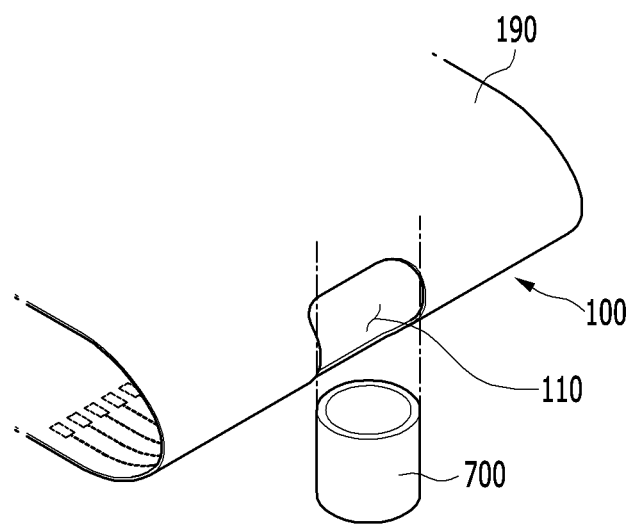
FIG. 8 is a drawing illustrating positions of the first flexible circuit board and a camera that are applied to the display device according to the exemplary embodiment.

FIG. 5 is a partial top plan view of a display device according to an exemplary embodiment. FIG. 6 is an exploded perspective view of a display panel, a first flexible circuit board, and a driving circuit substrate that are applied to the display device according to the exemplary embodiment. FIG. 7 is a drawing illustrating an unfolded configuration of the display panel, the first flexible circuit board, and the driving circuit substrate that are applied to the display device according to the exemplary embodiment. FIG. 8 is a drawing illustrating positions of the first flexible circuit board and a camera that are applied to the display device according to the exemplary embodiment.

Referring to FIGS. 5 and 7, the display device 500 according to the exemplary embodiment includes a display panel 900, a first flexible circuit board 100, a driving circuit substrate 300, and a camera 700. The display device 500 can further include a speaker 510, an illumination sensor, and a proximity sensor 530.

The display panel 900 can include a plurality of pixels that can display images. For example, the display panel 900 can be formed as an OLED display panel. However, the display device according to the exemplary embodiment is not limited to the OLED display panel, and it can be formed as an LCD panel, a plasma display panel (PDP), a field effect display (FED) panel, an electrophoretic display (EOD) panel, or the like.

The pixels can display images through driving signals and power supplied by the first flexible circuit board 100.

Referring to FIG. 6, a panel pad portion 910 can be formed at an edge of the display panel 900. Terminal pads elongated from wires of the display panel 900 are formed at the panel pad portion 910. The panel pad portion 910 is connected to the first pad portions 130a and 130b of the first flexible circuit board 100 to be supplied with the electrical signal(s) necessary for driving the display panel 900, for example, the driving signal or power.

Referring to FIGS. 1 and 6, one end portion of the first flexible circuit board 100 is connected to the display panel 900 to be able to supply the aforementioned driving signal(s) or power to the display panel 900. The first flexible circuit board 100 is connected to the display panel 900 by bonding the first pad portions 130a and 130b to the panel pad portion 910.

The other end portion of first flexible circuit board 100 can be connected to the driving circuit substrate 300. The first flexible circuit board 100 can be connected to the driving circuit substrate 300 by bonding the second pad portion 170 to the driving pad portion 310 of the driving circuit substrate 300.

The first flexible circuit board 100 further includes a first base film 190, a plurality of first signal wires 140, 140a, and 140b, a dummy wire 145, first to third pad portions 130, 170, and 135, and an IC chip 150. Further, in an exemplary embodiment, at least one first through-hole 110 is formed in the first flexible circuit board 100. Even though a plurality of through-holes can be formed in the flexible circuit board 100, a flexible circuit board in which one through-hole 110 is formed will be described in the present exemplary embodiment. In the embodiment of FIG. 6, the first flexible circuit board 100 is substantially the same as that shown in FIG. 1.

In the display device 500 according to the exemplary embodiment, the first flexible circuit board 100 can be a COF on which the IC chip 150 is mounted.

As described above, the first signal wires 140 is formed on the base film 190 to serve to transmit an electrical signal necessary for driving the display panel 900 from an external driving circuit to the display panel.

The first signal wires 140 can be formed on the base film 190 to cross the bending area BA. The first signal wires 140 are formed in the remaining area, that is, in areas I and III other than the peripheral area of the through-hole 110.

First pad portions 130a and 130b are formed at one end portion of the first signal wires 140a and 140b. Further, a second pad portion 170 is formed at the other end portion of the first signal wires 140a and 140b. The first pad portions 130a and 130b can be connected to the display panel 900, and the second pad portion 170 can be connected to the driving circuit substrate 300.

According to the exemplary embodiment, a dummy wire 145 can be formed on the first base film 190. The dummy wire 145 is formed to be adjacent to the first through-hole 110, and it is arranged to be substantially parallel to the first signal wires 140a and 140b formed in areas I and III. That is, the dummy wire 145 is formed in area II to cross the bending area BA.

As shown in FIG. 1, the third pad portion 135 is formed at one end portion of the dummy wire 145. The third pad portion 135 is arranged in a line with the first pad portions 130a and 130b. The first and third pad portions 130a, 130b and 135 can be connected to the display panel 900 of the display device.

The dummy wire 145 and third pad portion 135 do not transmit an electrical signal necessary for driving the display panel. The third pad portion 135 provides only a bond to the display panel 900. When there is no the third pad portion 135, the bonding force with the display panel 900 weakens in area II and the display panel and the first pad portions 130a and 130b can be gradually separated from each other in areas I and III adjacent to area II.

Meanwhile, the IC chip 150 can be mounted on the base film 190 to generate a driving signal. For example, an electrical signal generated by the driving circuit substrate 300 is input to the second pad portion 170, and then it can be transmitted to the first pad portion 130a and 130b through the IC chip 150.

For example, the IC chip 150 can be a scan driving circuit generating a scan signal or a data driving circuit generating a data signal. Accordingly, the IC chip 150 can receive a control signal to generate the scan signal or the data signal. The scan signal or the data signal can be transmitted to the display panel through the signal wires 140a and 140b arranged on the base film 190.

Referring to FIGS. 5 and 6, the driving circuit substrate 300 can include a driving circuit that can drive the display panel 900 and a touch panel (not shown). According to the exemplary embodiment, the driving circuit substrate 300 can be formed as an FPCB.

For example, a timing controller (not shown) can be mounted on the driving circuit substrate 300. The timing controller generates a control signal for controlling an image displayed on the display panel 900 and the control signal can be transmitted to the IC chip 150 through the first flexible circuit board 100.

In addition, a plurality of electronic components controlling various operations of the display device according to the present exemplary embodiment can be mounted on the driving circuit substrate 300. For example, a camera module, a speaker module, and/or a memory chip interlocking and operating with the display panel 900 can be mounted thereon.

Referring to FIG. 7, the display panel 900, the first flexible circuit board 100, and the driving circuit substrate 300 can be sequentially combined in the display device 500 according to the exemplary embodiment. As shown in FIG. 5, the first flexible circuit board 100 is formed to be bent such that the display panel 900 and the driving circuit substrate 300 face each other.

That is, as the first flexible circuit board 100 is bent, the driving circuit substrate 300 can be positioned at a rear surface of the display panel 900. However, in FIG. 5, since the display panel 900 is arranged at a rear surface of the driving circuit substrate 300, the display panel is not illustrated.

As shown in FIG. 8, a first through-hole 110 can be formed on the first base film 190. In the embodiment of FIG. 8, the first through-hole 110 is formed in the bending area BA.

According to the exemplary embodiment, when the first flexible circuit board 100 is bent in the bending area BA, a groove is formed in a lateral surface of the first flexible circuit board 100. For example, when the first flexible circuit board 100 is bent, the sectional shape of the first through-hole 110 is changed from a circular shape to a semi-circular shape. That is, when the bent first flexible circuit board 100 is viewed from the top toward the bottom in FIG. 8, the first through-hole 110 is changed to a groove shape.

According to the exemplary embodiment, as shown in FIG. 5, at least portion of the camera 700 that can capture external images can be arranged in the first through-hole 110 that is bent.

In the embodiment of FIG. 5, the sectional shape of the bent first through-hole 110 can be formed to correspond to the shape of the camera 700. That is, the sectional shape of the bent first through-hole 110 can be formed depending on the shape of the camera 700. For example, when the sectional shape of the camera 700 is circular, the sectional shape of the bent first through-hole 110 can be semicircular or circular.

Accordingly, the camera 700 can be formed in close proximity to a center of the display device 500. Further, when the camera 700 is arranged in close proximity to the center of the display device 500, images of objects can be accurately captured by the camera 700. This will be described in detail with reference FIGS. 9 and 10.

Figure 9:
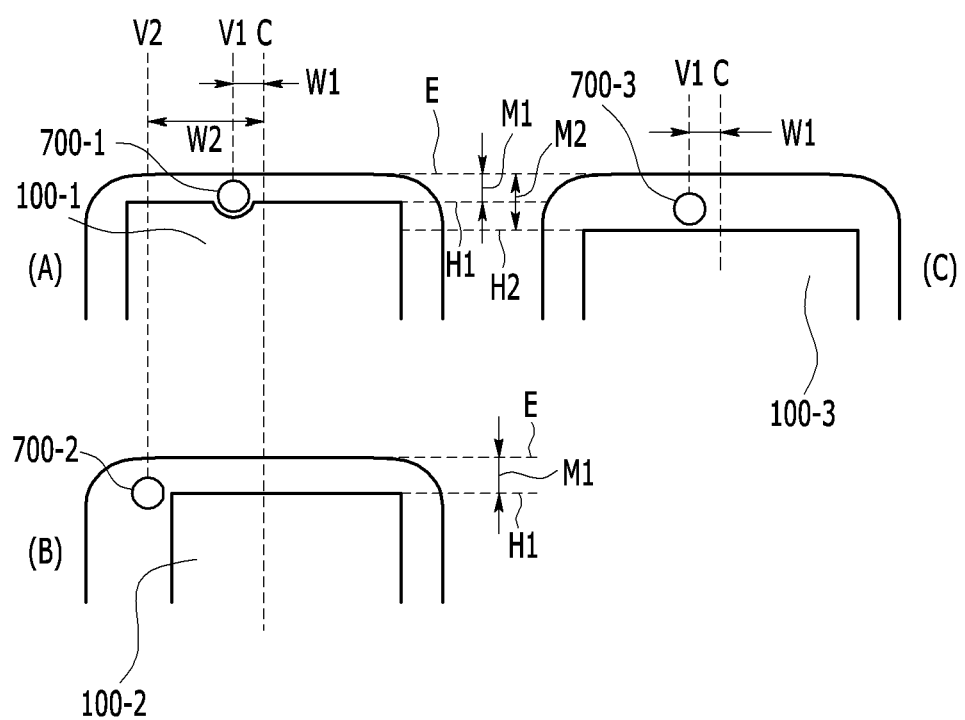
FIG. 9 is a drawing showing a comparison between when a through-hole is formed in the first flexible circuit board and when the through-hole is not formed therein.
Figure 10:
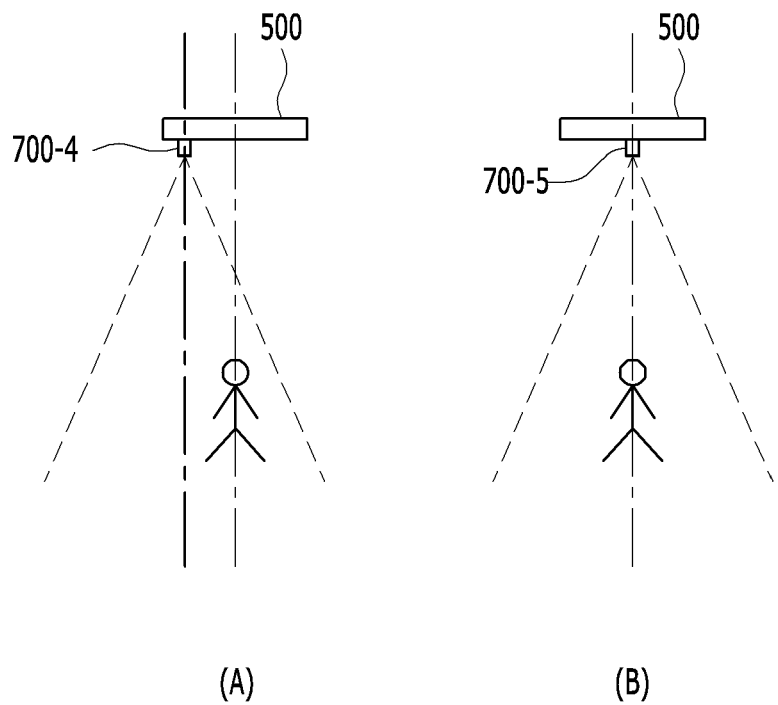
FIG. 10 is a drawing showing a comparison between when a camera is formed at a center of the display device and when the camera is not formed thereat.

FIG. 9 is a drawing showing a comparison between when a through-hole is formed in the first flexible circuit board and when the through-hole is not formed therein. FIG. 10 is a drawing showing a comparison between when a camera is arranged at a center of the display device and when the camera is not arranged thereat.

Referring to FIG. 9, arranging the camera in close proximity to the center of the display device without increasing dead space in the display device 500 according to the exemplary embodiment will be described.

Referring to part (A) of FIG. 9, in the display device according to the exemplary embodiment, an imaginary line through the center of the display device 500 is referred to as a center line (C), and an imaginary line at which a camera 700-1 is positioned is referred to as a first vertical line (V1). An imaginary line passing through an upper edge of the display device 500 in a horizontal direction is referred to as an edge line (E), and an imaginary line passing through an upper edge of a first flexible circuit board 100-1 is referred to as a first horizontal line (H1).

The distance between the center line (C) and the first vertical line (V1) is referred to as a first horizontal distance (W1), and the distance between the edge line (E) and the first horizontal line (H1) is referred to as a first vertical distance (M1).

An exemplary embodiment in which a first through-hole is not formed in a first flexible circuit board 100-2 will be described with reference to part (B) of FIG. 9. The camera 700-2 must be arranged at a left outside edge of a first flexible circuit board 100-2 in order to maintain the distance between the edge line (E) and the first horizontal line (H1) at the first vertical distance (M1) in the same way as part (A) of FIG. 9. That is, the camera 700-2 is arranged on a second vertical line (V2) that is spaced apart from the center line (C) by a second horizontal distance (W2). Accordingly, in part (B) of FIG. 9, the camera 700-2 can only be arranged to be spaced farther apart from the center line (C) than the camera 700-1 of part (A) of FIG. 9.

Referring part (C) of FIG. 9, a first flexible circuit board 100-3 is arranged below the first flexible circuit board 100-1 of part (A) of FIG. 9 in order to maintain a distance between the center line (C) and the first vertical line (V1) at the first horizontal distance (W1) in the same way as part (A) of FIG. 9. That is, since a second vertical distance (M2) is a distance between the edge line (E) and the second horizontal (H2), the dead space width (M1) of part (A) of FIG. 9 is larger than the dead space width (M2) of part (C) of FIG. 9 in order to accommodate the camera 700-3.

Accordingly, in the display device 500 according to the exemplary embodiment, since the first through-hole 110 is formed in the first flexible circuit board 100, the camera 700 can be arranged in close proximity to the center of the display device 500 without increasing dead space.

Objects can be accurately captured since the camera 700 is substantially arranged at a center portion of the display device 500 according to the exemplary embodiment and this will be described with reference to FIG. 10.

An exemplary embodiment in which a camera 700-4 is not arranged at the center of the display device 500 will be described with reference to part (A) of FIG. 10. When the camera 700-4 is arranged at a left side to be spaced apart from the center of the display device 500, when the display device 500 is positioned parallel to an object to be captured, an image of the object is not able to be captured at a center of the camera.

However, as shown in part (B) of FIG. 10, when a camera 700-5 is positioned at the center of the display device 500, and the display device 500 is positioned parallel to the object to be captured, an image of the object is able to be accurately captured at a center of the camera.

Accordingly, the camera 700 is able to be arranged in close proximity to the center of the display device 500 by the first through-hole 110 in the display device 500 according to the exemplary embodiment, thereby being able to accurately capture images of objects.

An exemplary variation of the first flexible circuit board applied to the display device according to the exemplary embodiment will be now described. When describing the exemplary variation of the first flexible circuit board, a detailed description of the same components as those of the aforementioned first flexible circuit board will be omitted.

Figure 11:
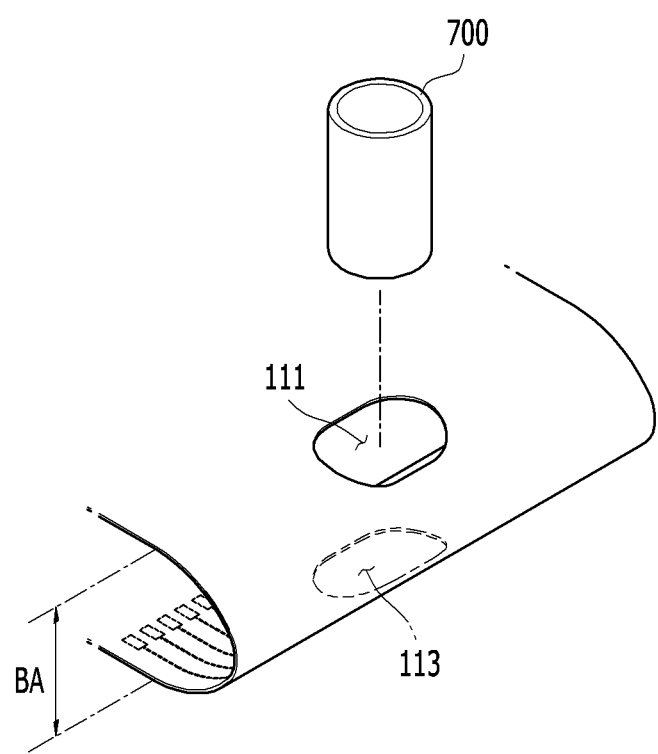
FIG. 11 is a drawing illustrating an exemplary variation of the first flexible circuit applied to the display device according to the exemplary embodiment.

FIG. 11 is a drawing illustrating an exemplary variation of the first flexible circuit applied to the display device according to the exemplary embodiment.

Referring to FIG. 11, a pair of through-holes 111 and 113 can be formed in the flexible circuit board 100. The pair of the through-holes 111 and 113 are symmetrically arranged based on the bending area BA. As shown in FIG. 3, the pair of the through-holes 111 and 113 can be arranged in a direction perpendicular to the bending area BA.

Referring to FIG. 11, when the flexible circuit board 100 is bent based on the bending area BA, the pair of the through-holes 111 and 113 face each other. The pair of the through-holes 111 and 113 are arranged to be parallel, and the camera 700 can pass through the pair of the through-holes 111 and 113.

Hereinafter, a display device according to another exemplary embodiment will be described. When describing the display device according to another exemplary embodiment, a detailed description of the same components as those of the aforementioned display device will be omitted.

Figure 12:
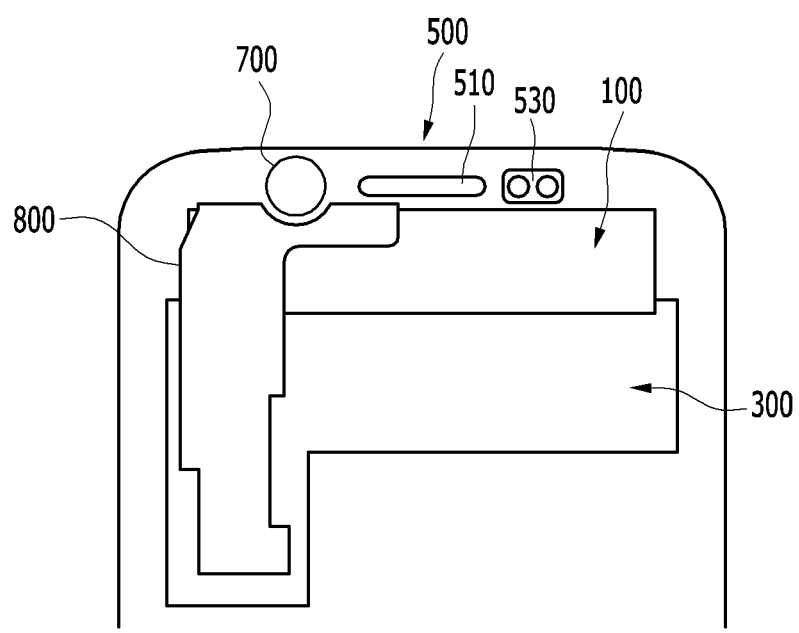
FIG. 12 is a partial top plan view of a display device according to another exemplary embodiment.

FIG. 12 is a top plan view of a display device according to another exemplary embodiment.

Referring to FIG. 12, the display device according to the other exemplary embodiment additionally includes a touch panel (not shown) and a second flexible circuit board 800 compared to the display device according to the exemplary embodiment described above.

The touch panel (not shown) that detects the user's touch is arranged on a display panel (not shown). One end portion of the second flexible circuit board 800 can be combined with the touch panel, and the other end portion of the second flexible circuit board 800 can be combined with the driving circuit substrate 300.

In the embodiment of FIG. 12, as in the first flexible circuit board 800, a second through-hole can be formed in the second flexible circuit board 800. The second through-hole is formed in a bending area of the second flexible circuit board 800.

Like the first flexible circuit board 100, when the second flexible circuit board 800 is bent in the bending area BA, a groove is formed in a lateral surface of the second flexible circuit board 100. At least part of the camera 700 is positioned in the second through-hole that is bent.

In the embodiment of FIG. 12, the camera 700 is positioned in the aforementioned first and second through-holes. Therefore, the camera 700 can be arranged in close proximity to the center of the display device 500 without increasing dead space.

According to at least one exemplary embodiment, the camera 700 can be arranged in close proximity to the center of the display device 500 without increasing dead space by arranging the camera in the through-hole of the flexible circuit board. Further, according to at least one exemplary embodiment, images of objects can be accurately captured by arranging the camera 700 in close proximity to the center of the display device 500.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a display panel configured to display an image;
   a first flexible circuit board having a first end electrically connected to the display panel and a second end opposing the first end, the first flexible circuit board having a first through-hole in a bending area of the first flexible circuit board;

a driving circuit substrate electrically connected to the second end of the first flexible circuit board, the driving circuit substrate being configured to drive the display panel; and a camera configured to capture an image, wherein the first flexible circuit board is bent along the bending area so that the driving circuit substrate and the display panel overlap each other, wherein the first flexible circuit board comprises a plurality of first signal wires disposed along a first direction, and each of the plurality of first signal wires crosses the bending area along a second direction perpendicular to the first direction, and wherein at least a portion of the camera is positioned in the first through-hole.

2. The display device of claim 1, further comprising:
a touch panel disposed on the display panel; and
a second flexible circuit board having an end electrically connected to the touch panel and a bending area, the second flexible circuit board having a second through-hole in the bending area of the second flexible circuit board.

3. The display device of claim 2, wherein the second flexible circuit board is bent along the bending area and wherein the portion of the camera is positioned in the first and second through-holes.

4. The display device of claim 1, wherein the first flexible circuit board includes:
a first base film, the first base film having the first through-hole therein; and
an IC chip disposed on the first base film and electrically connected to the first signal wires.

5. The display device of claim 4, wherein the first flexible circuit board further includes:
a first pad region in which a first end of each of the first signal wires is located; and
a second pad region in which a second end of each of the first signal wires is located, the first and second pad regions opposing each other.

6. The display device of claim 5, wherein the first flexible circuit board further includes:
a dummy wire being substantially parallel to the first signal wires and adjacent to the first through-hole; and
a third pad region in which an end of the dummy wire is located, wherein the third pad region is connected to the display panel.

7. The display device of claim 6, wherein the first and third pad regions are arranged in a line.

8. The display device of claim 1, wherein a sectional shape of the first through-hole corresponds to the shape of the camera.

9. A display device comprising:
a display panel configured to display an image;
a first flexible circuit board having a first end electrically connected to the display panel and a second end opposite the first end, the first flexible circuit board having a pair of first through-holes therein;
a driving circuit substrate electrically connected to the second end of the first flexible circuit board, the driving circuit substrate being configured to drive the display panel; and
a camera configured to capture an image, wherein the first flexible circuit board is bent along a bending area so that the driving circuit substrate and the display panel overlap each other, and wherein the camera passes through the pair of the first through-holes.

10. A display device comprising:
a display panel configured to display an image;
a first flexible circuit board having a first end electrically connected to the display panel and a second end opposing the first end, the first flexible circuit board having a first through-hole in a bending area of the first flexible circuit board;
a driving circuit substrate electrically connected to the second end of the first flexible circuit board, the driving circuit substrate being configured to drive the display panel; and
a camera configured to capture an image, wherein the first flexible circuit board is bent along the bending area so that the driving circuit substrate and the display panel overlap each other, wherein at least a portion of the camera is positioned in the first through-hole, and wherein the first flexible circuit board comprises:
a first base film, the first base film having the first through-hole therein;
a plurality of first signal wires disposed on the first base film so as to cross the bending area; and
a plurality of dummy wires disposed between the plurality of first signal wires and the first through-hole.

11. The display device of claim 10, further comprising:
a touch panel disposed on the display panel; and
a second flexible circuit board having an end electrically connected to the touch panel and a bending area,
wherein the second flexible circuit board has a second through-hole in the bending area of the second flexible circuit board.

12. The display device of claim 11, wherein the second flexible circuit board is bent along the bending area and wherein the portion of the camera is positioned in the first and second through-holes.

13. The display device of claim 10, wherein the first flexible circuit board further includes:
an IC chip disposed on the first base film and electrically connected to the first signal wires.

14. The display device of claim 13, wherein the first flexible circuit board further includes:
a first pad region in which a first end of each of the first signal wires is located; and
a second pad region in which a second end of each of the first signal wires is located, the first and second pad regions opposing each other.

15. The display device of claim 14, wherein the first flexible circuit board further includes:
a third pad region in which an end of the dummy wire is located, wherein the third pad region is connected to the display panel.

16. The display device of claim 15, wherein the first and third pad regions are arranged in a line.

17. The display device of claim 10, wherein a sectional shape of the first through-hole corresponds to the shape of the camera.

* * * * *